United States Patent
Viviescas et al.

(10) Patent No.: US 10,644,692 B2
(45) Date of Patent: May 5, 2020

(54) SYSTEM AND METHOD TO DETERMINE A POWER-UP PARAMETER FOR A CIRCUIT BOARD

(71) Applicant: MOTOROLA SOLUTIONS, INC., Schaumburg, IL (US)

(72) Inventors: David Viviescas, Doral, FL (US); Chun P. Leung, Sunrise, FL (US); Kirk B. Stuart, Weston, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 185 days.

(21) Appl. No.: 15/258,841

(22) Filed: Sep. 7, 2016

(65) Prior Publication Data

US 2018/0067534 A1  Mar. 8, 2018

(51) Int. Cl.
  *H03K 17/22* (2006.01)
  *G06F 1/26* (2006.01)
(52) U.S. Cl.
  CPC ............... *H03K 17/22* (2013.01); *G06F 1/26* (2013.01)
(58) Field of Classification Search
  CPC .................................................. H06K 1/0266
  See application file for complete search history.

(56) References Cited

U.S. PATENT DOCUMENTS

| 6,460,165 | B1 * | 10/2002 | Ismail ................. G06F 17/5036 716/115 |
| 7,631,176 | B2 | 12/2009 | Weiss et al. |
| 9,043,495 | B2 | 5/2015 | Jiang |
| 2008/0042701 | A1 * | 2/2008 | Weiss .................. H05K 1/0266 327/143 |
| 2014/0022834 | A1 * | 1/2014 | Jain .......................... G11C 8/06 365/154 |

OTHER PUBLICATIONS

Mahmood Nahvi, PhD; Joseph A. Edminister: "Schaum's Outline of Electric Circuits, Sixth Edition". Higher-Order Circuits and Complex Frequency, Chapter 8 (McGraw-Hill Professional, 2014), AccessEngineering, accessed from https://www.accessengineeringlibrary.conn/ on May 14, 2019 (Year: 2014).*

* cited by examiner

*Primary Examiner* — Kim Huynh
*Assistant Examiner* — Joshua Neveln
(74) *Attorney, Agent, or Firm* — Michael Best & Friedrich LLP (57) ABSTRACT

A system and method to determine a power-up parameter for a circuit board. The method includes electrically exciting a second-order circuit to generate an underdamped transient response. The method includes receiving, at a comparator coupled to the second-order circuit, the underdamped transient response. The method includes generating, in response to the underdamped transient response received at the comparator, a plurality of edges. The method includes receiving, at a single general purpose input/output pin of the electronic processor, the plurality of edges. The method includes determining a first response parameter based on a plurality of edges. The method includes determining a second response parameter based on the plurality of edges. The method includes determining the power-up parameter based on the first response parameter and the second response parameter.

16 Claims, 7 Drawing Sheets

| | DISCHARGE TIME (ms) | | | | |
|---|---|---|---|---|---|
| | 22 uF | 4.7 uF | 1 uF | 0.22 uF | 0.068 uF |
| 30.1 Ω | 3.311 | 0.707 | 0.151 | 0.033 | 0.010 |
| 38.3 Ω | 4.213 | 0.900 | 0.192 | 0.042 | 0.013 |
| 48.7 Ω | 5.357 | 1.144 | 0.244 | 0.054 | 0.017 |
| 61.9 Ω | 6.809 | 1.455 | 0.310 | 0.068 | 0.021 |
| 78.7 Ω | 8.657 | 1.849 | 0.394 | 0.087 | 0.027 |

FIG. 4A

| | DAMPING FREQUENCY (MHz) | | | | |
|---|---|---|---|---|---|
| | 22 uF | 4.7 uF | 1 uF | 0.22 uF | 0.068 uF |
| 560 nH | 0.285 | 0.616 | 1.336 | 2.849 | 5.125 |
| 300 nH | 0.389 | 0.842 | 1.826 | 3.892 | 7.001 |
| 220 nH | 0.455 | 0.983 | 2.132 | 4.545 | 8.176 |
| 150 nH | 0.550 | 1.191 | 2.582 | 5.505 | 9.901 |
| 110 nH | 0.643 | 1.391 | 3.015 | 6.482 | 11.562 |

FIG. 4B

SYSTEM AND METHOD TO DETERMINE A POWER-UP PARAMETER FOR A CIRCUIT BOARD

BACKGROUND OF THE INVENTION

Circuit boards are integrated into electronic devices. Various electrical (for example, capacitors and resistors) and electronic components (for example, microprocessors and other integrated circuits) are mounted on or to a circuit board and the circuit board includes traces and other elements that electrically connect the various components on the circuit board. Some circuit boards may share common processing architectures or power management control circuits, but they may have different hardware configurations. For example, a particular circuit board may go through multiple versions over the product life of an electronic device, and different models of the electronic device may include different features. Such circuit boards are similar, but not identical, and may require different control software versions or power-up sequences.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

To account for the differences in control software of different circuit boards, multiple versions of the control software and multiple power-up sequences may be stored in each circuit board's memory. However, failure to load the correct control software or power-up using the correct sequence may cause a circuit board to malfunction, or may even damage the circuit board. Accordingly, systems and methods have been developed for identifying a circuit board, and loading the appropriate control software version or power-up and sequence. While systems and methods of identifying a circuit board exist, they are not always satisfactory.

One exemplary embodiment provides a method to determine a power-up parameter for a circuit board including an electronic processor. The method includes electrically exciting a second-order circuit to generate an underdamped transient response. The method includes receiving, at a comparator coupled to the second-order circuit, the underdamped transient response. The method includes generating, in response to the underdamped transient response received at the comparator, a plurality of edges. The method includes receiving, at a single general purpose input/output pin of the electronic processor, the plurality of edges. The method includes determining a first response parameter based on a plurality of edges. The method includes determining a second response parameter based on the plurality of edges. The method includes determining the power-up parameter based on the first response parameter and the second response parameter.

Another exemplary embodiment provides a system to determine a power-up parameter for a circuit board including an electronic processor. The system includes a second-order circuit configured to generate an underdamped transient response when electrically excited, a comparator coupled to the second-order circuit. The comparator is configured to, in response to receiving the underdamped transient response, generate a plurality of edges. The electronic processor is configured to receive, at a single general purpose input/output pin, the plurality of edges. The electronic processor is further configured to determine a first response parameter based on a plurality of edges. The electronic processor is further configured to determine a second response parameter based on the plurality of edges. The electronic processor is further configured to determine the power-up parameter based on the first response parameter and the second response parameter.

For ease of description, some or all of the exemplary systems presented herein are illustrated with a single exemplar of each of its component parts. Some examples may not describe or illustrate all components of the systems. Other exemplary embodiments may include more or fewer of each of the illustrated components, may combine some components, or may include additional or alternative components.

Multiple hardware versions of a similar circuit board may include in their respective memories multiple versions of software (for example, operating systems) and multiple power-up sequences. Upon boot-up, the circuit board's electronic processor determines the circuit board's identity, and selects the correct software version and power-up sequence to execute based on the identity. Multiple input pins are used to determine the identity. For example, using three pins, eight unique binary sequences may be used to identify eight versions of the board. However, this method has limited usefulness, because an additional pin, and its corresponding traces on the circuit board, must be used by the processor to increase the amount of available identifiers. Increasing the identifiers increases the circuit board footprint needed to identify the circuit board. Accordingly, systems and methods are provided herein to identify a circuit board using a second-order circuit and a single general purpose input/output pin.

Figure 1A:
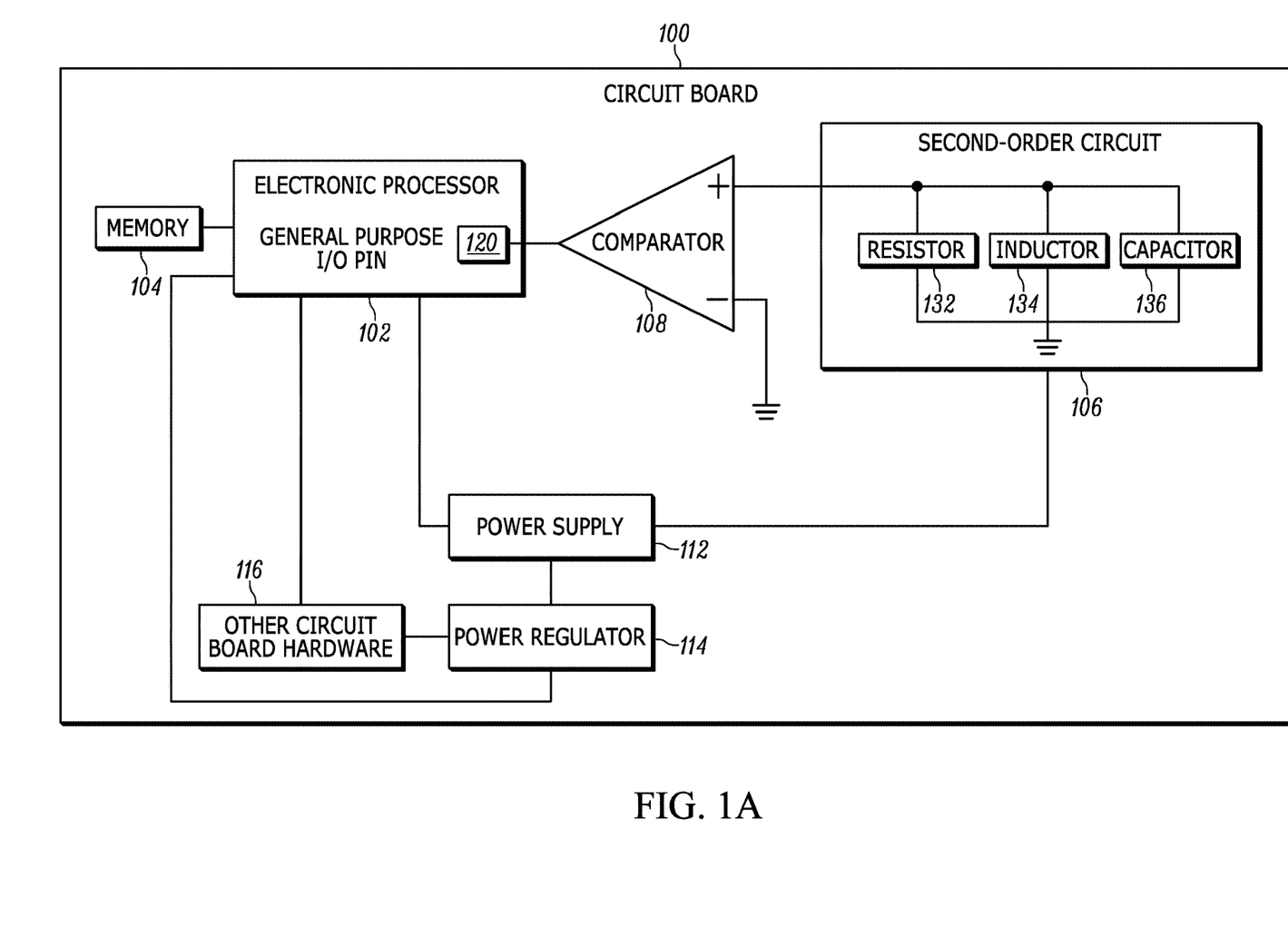
FIG. 1A, FIG. 1B and FIG. 1C are block diagrams of circuit boards, in accordance with some embodiments.

FIG. 1A is a block diagram of one exemplary embodiment of a circuit board 100. The circuit board 100 is a printed circuit board for supporting and electrically connecting electronic components using conductive features (for example, traces and pads) laminated onto a substrate. The circuit board 100 includes an electronic processor 102, a memory 104, a second-order circuit 106, a comparator 108, a power supply 112, a power regulator 114, and other circuit board hardware 116. The electronic processor 102, the memory 104, the second-order circuit 106, the comparator 108, the power supply 112, the power regulator 114, the other circuit board hardware 116, as well as other various modules are coupled to each other by or through one or more control or data buses, or a combination thereof, that enable communication therebetween.

In some embodiments, the electronic processor 102 is a microprocessor configured to retrieve instructions and data from the memory 104 and execute, among other things, instructions to perform the methods described herein. In other embodiments, the electronic processor 102 may be a power management integrated circuit (for example, a state machine). In such embodiments, the electronic processor 102 is configured to execute a power-up sequence for the circuit board 100 and the other circuit board hardware 116 by, for example, controlling the power supply 112 and the power regulator 114. The power-up sequences may be stored in and retrieved from the memory 104, or may be integrated into a memory (not shown) of the electronic processor 102. In some embodiments, the electronic processor 102 is a microprocessor that includes an integrated power management integrated circuit.

The electronic processor 102 includes a general purpose input/output (GPIO) pin 120. The general purpose input/output pin 120 is a generic pin, which may be configured as either an input or an output by the electronic processor 102 at run time. As described in greater detail below, in some embodiments, the electronic processor 102 configures the general purpose input/output pin 120 as an input pin to receive the output of the comparator 108. The electronic processor 102 includes other input/output interfaces, which for brevity are not described herein.

The memory 104 may include read-only memory (ROM), random access memory (RAM), other non-transitory computer-readable media, or a combination thereof. The memory 104 may store software (for example, operating systems) for controlling the circuit board 100 and the other circuit board hardware 116.

In the embodiment illustrated, the second-order circuit 106 includes a resistor 132, an inductor 134, and a capacitor 136 wired in parallel. The second-order circuit 106 is configured to generate an underdamped transient response when it is electrically excited (for example, by a transient step function). In alternative embodiments, the second-order circuit 106 may be any circuit that produces an underdamped second-order transient response when electrically excited.

The underdamped transient response is received by the comparator 108. As described in greater detail below, the comparator 108 is configured to output a digital signal based on the underdamped transient response.

The power supply 112 (which may be a conventional power supply) provides operational power and bias voltages to the components of the circuit board 100. The power regulator 114 regulates voltage from the power supply 112. They provide bias voltage levels appropriate to the components being powered. The power regulator 114 may be, for example, a low-dropout regulator. In some embodiments, the electronic processor 102 controls the power supply 112 and the power regulator 114 to provide power to the circuit board 100 and the other circuit board hardware 116. Although pictured with a single exemplary power regulator 114, embodiments of the circuit board 100 may include two or more power regulators, which are activated by the electronic processor 102 to provide power according to a power-up sequence. The other circuit board hardware 116 includes various digital and analog components.

Figure 1B:
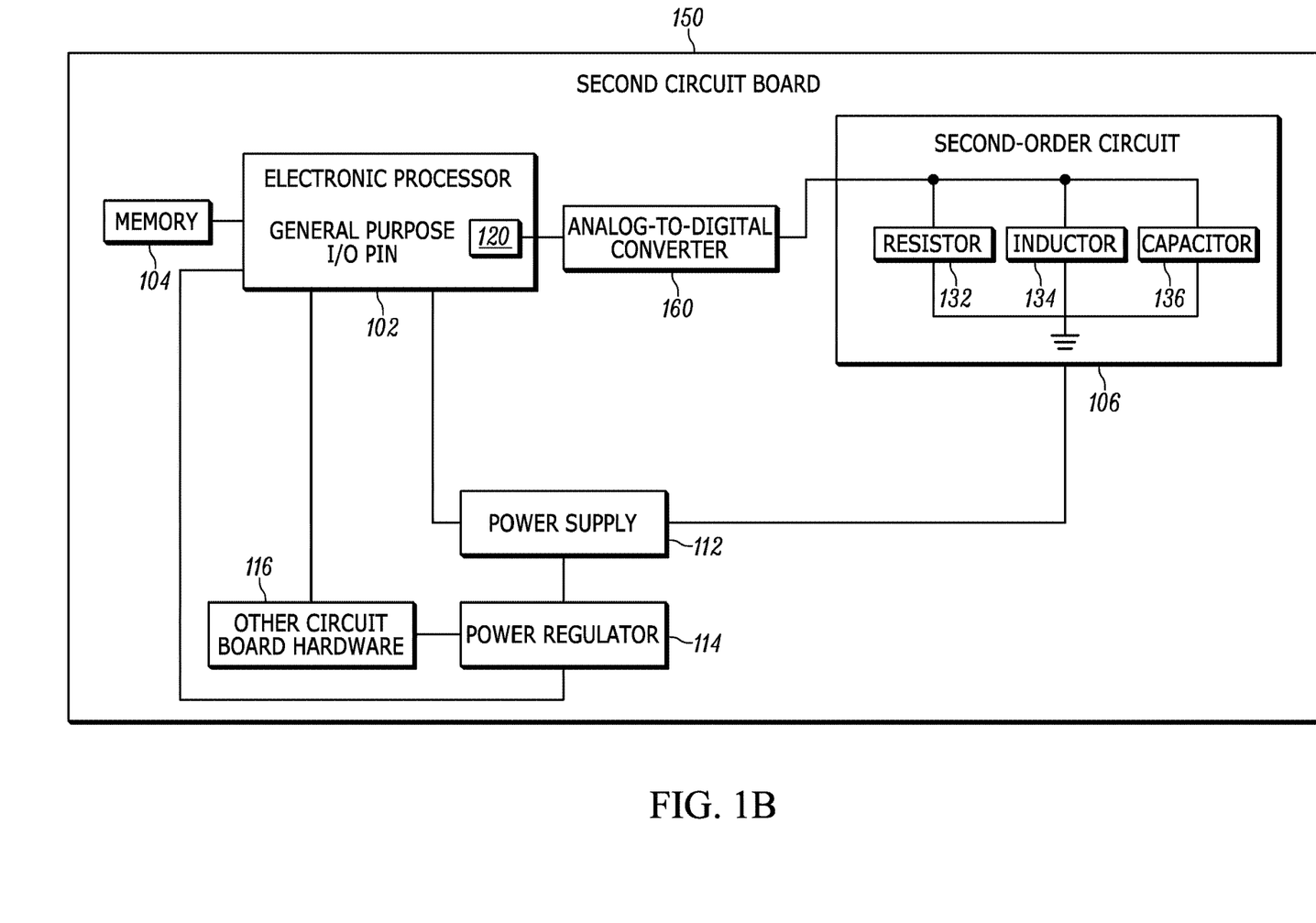

FIG. 1B is a block diagram of an exemplary embodiment of a second circuit board 150. The embodiment illustrated in FIG. 1B includes similar components and is configured similarly to the embodiment illustrated in FIG. 1A, but includes an analog-to-digital converter 160 in place of the comparator 108. The underdamped transient response is received by the analog-to-digital converter 160. As described in greater detail below, the analog-to-digital converter 160 is configured to output a digital signal based on the underdamped transient response, which signal includes, for example, a peak voltage based on the underdamped transient response. In the embodiment illustrated in FIG. 1B, the electronic processor 102 configures the general purpose input/output pin 120 as an input pin to receive the output of the analog-to-digital converter 160.

Figure 1C:
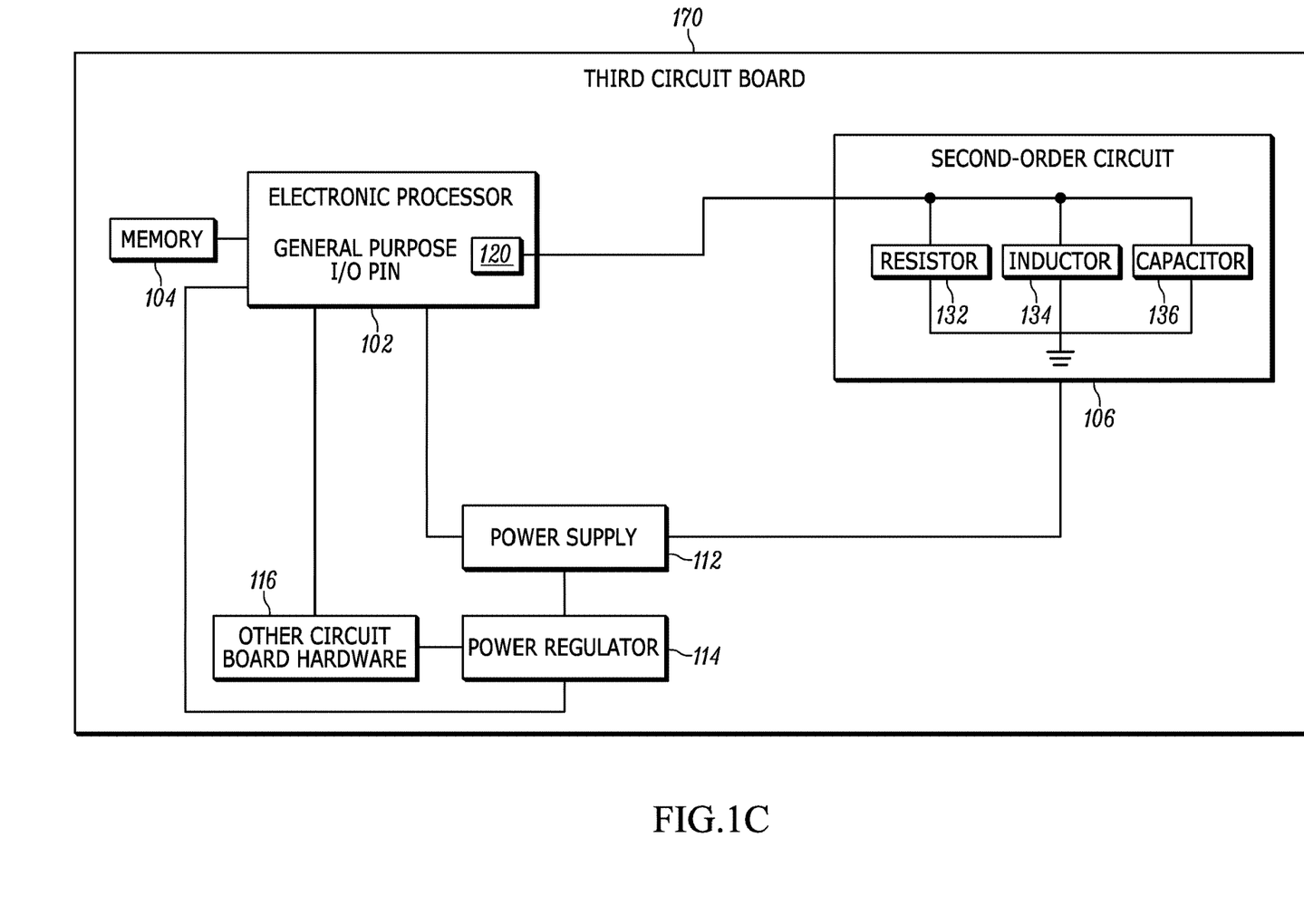

FIG. 1C is a block diagram of an exemplary embodiment of a third circuit board 170. The embodiment illustrated in FIG. 1C includes similar components and is configured similarly to the embodiment illustrated in FIG. 1A, but omits the comparator 108. The underdamped transient response is received directly by the general purpose input/output pin 120, which is configured by the electronic processor 102 as an input pin.

Figure 2:
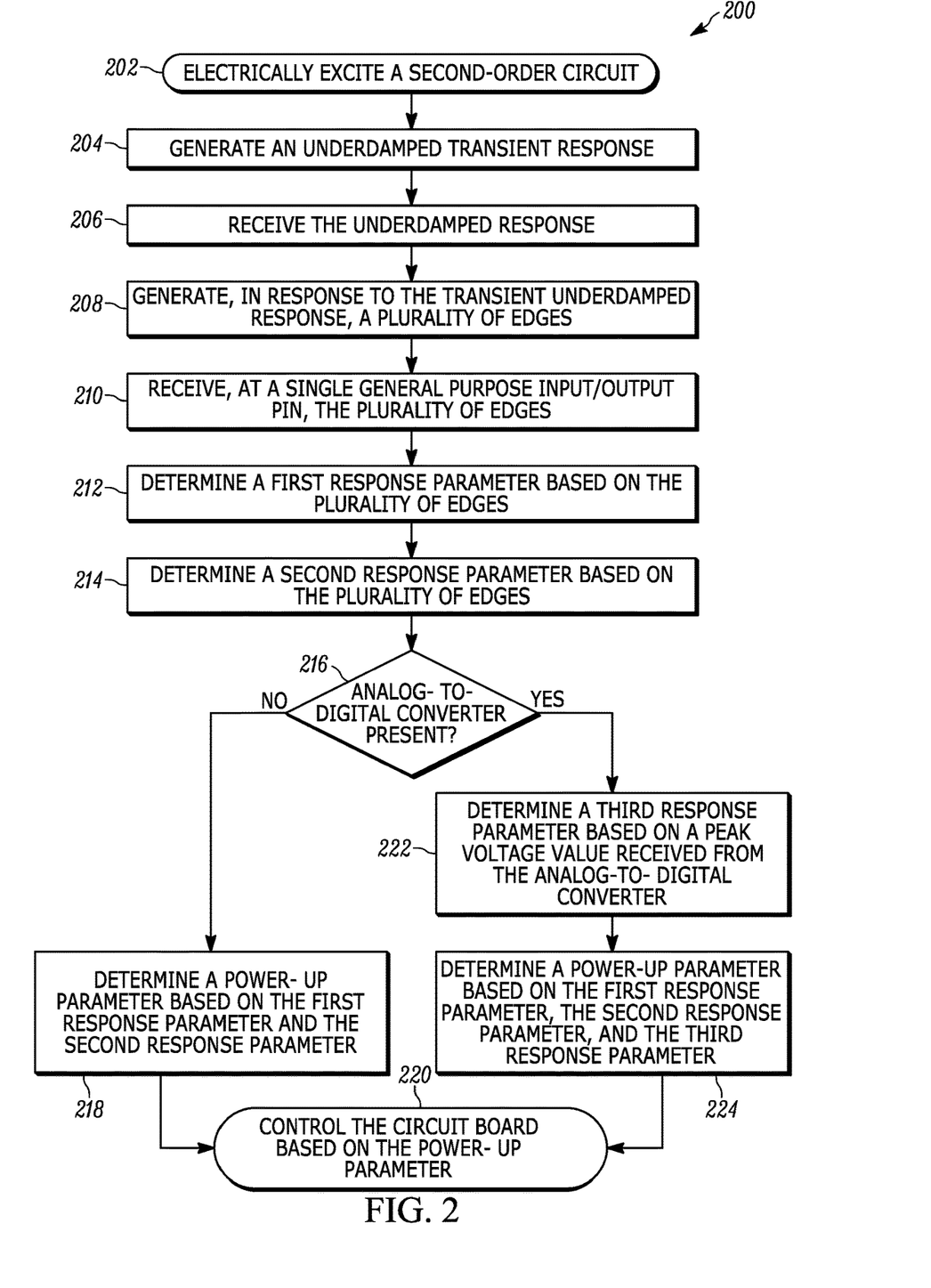
FIG. 2 is a flowchart of a method to determine a power-up parameter for the circuit board of FIG. 1, in accordance with some embodiments.

FIG. 2 is a flowchart of an exemplary method 200 to determine a power-up parameter for the circuit board 100. As an example, the method 200 is described in terms of a single electronic processor determining a single power-up parameter (for example, a board identity) using, in part, a parallel RLC circuit. This should not be considered limiting. Other embodiments may include alternate second-order circuit configurations. Some embodiments may be used to determine multiple power-up parameters for multiple electronic processors on a single circuit board.

At block 202, the second-order circuit 106 (including the resistor 132, the inductor 134, and the capacitor 136) is electrically excited (for example, by applying a transient function such as a step or an impulse). The electrical excitation may be applied by, for example, the power supply 112 upon power-up of the circuit board 100.

Figure 3A:
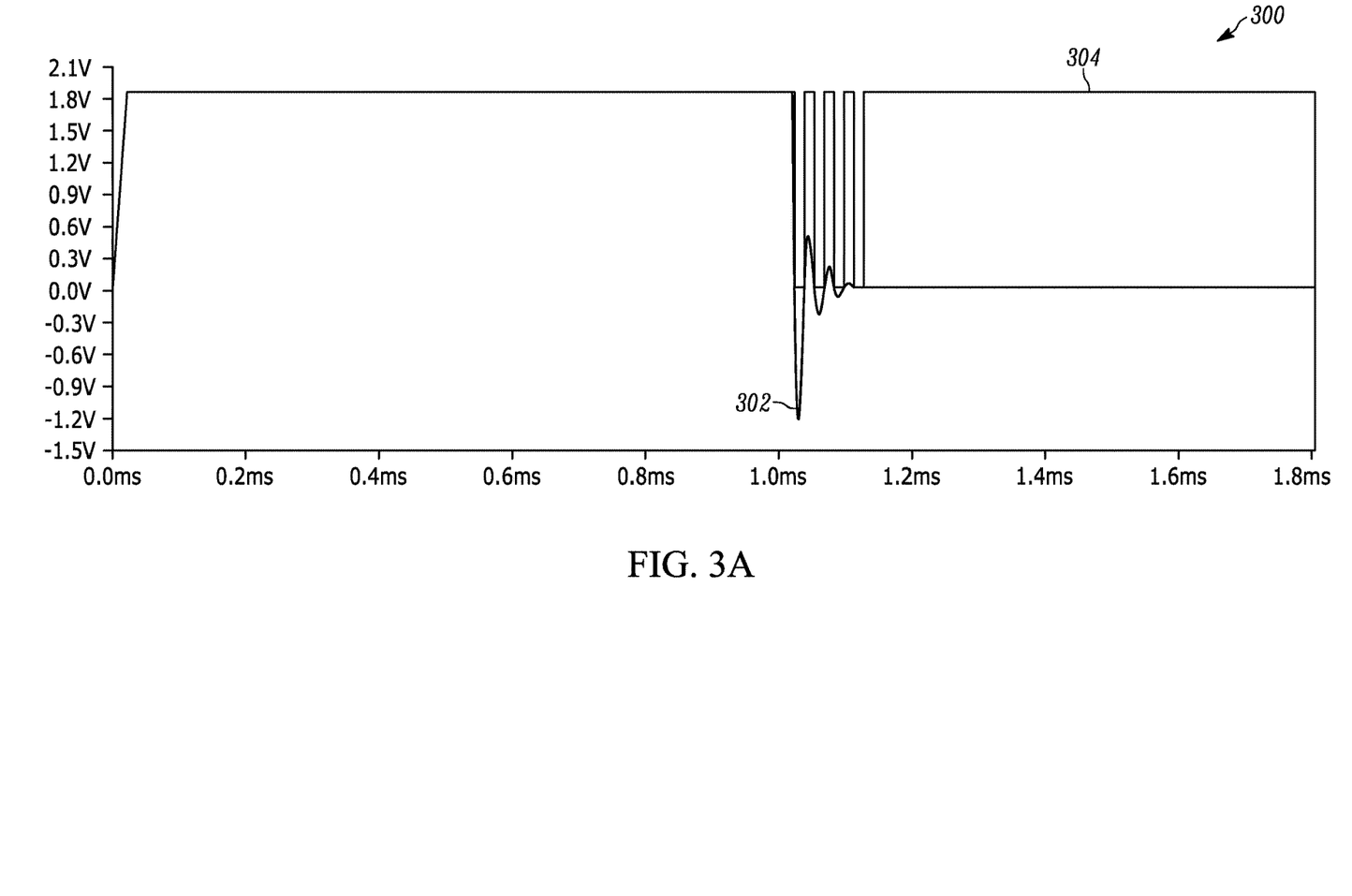
FIGS. 3A and 3B are line graphs illustrating an underdamped transient response and corresponding comparator output, in accordance with some embodiments.

At block 204, the electrical excitation generates an underdamped transient response (that is, an analog electrical signal). FIG. 3A is a line chart 300, which illustrates an underdamped transient response (represented by line 302).

Figure 3B:
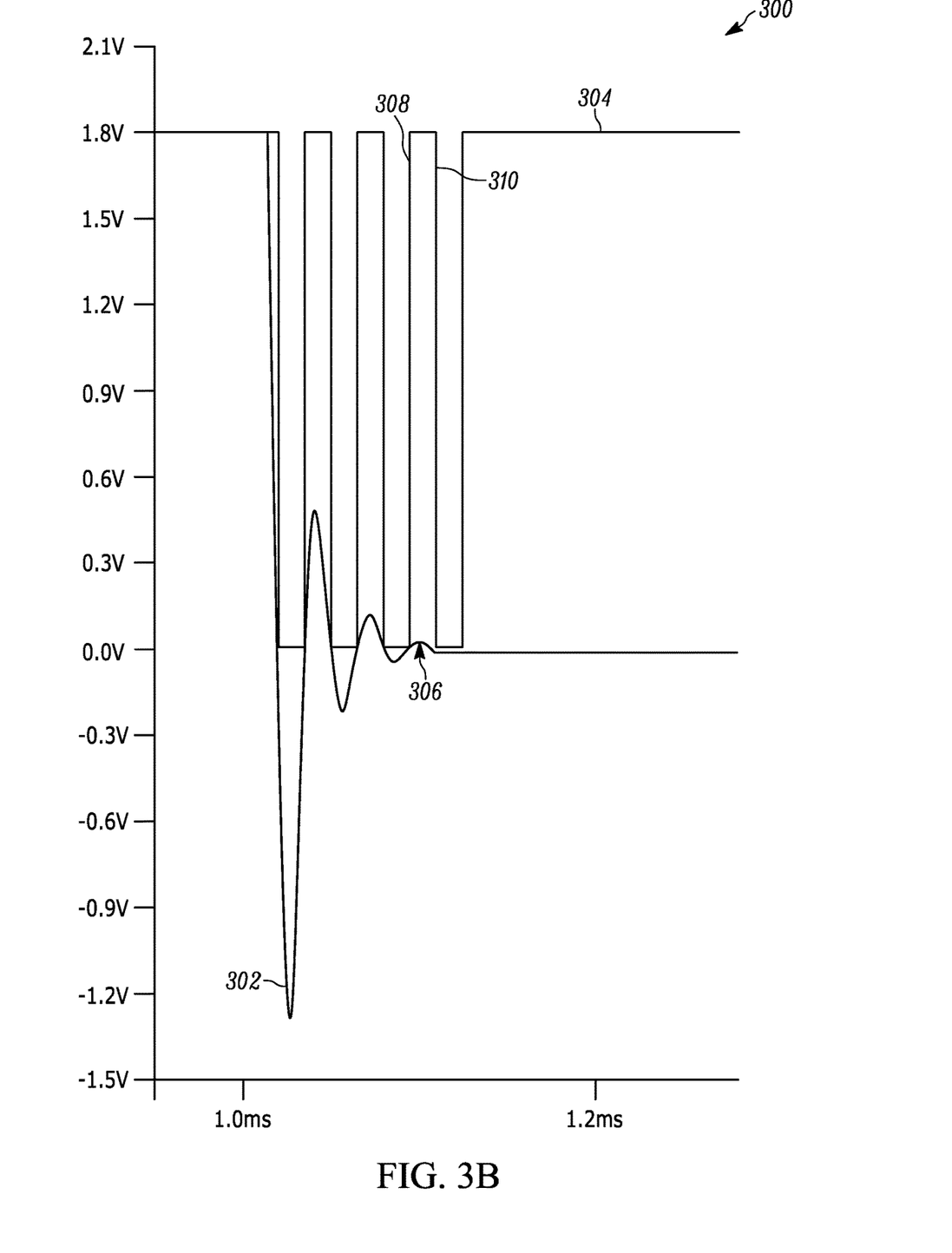

Returning to FIG. 2, at block 206, the comparator 108 receives the underdamped transient response. At block 208, the comparator 108 generates, in response to receiving the underdamped transient response, a digital signal (represented by line 304) including a plurality of edges 306 (See FIG. 3B). The plurality of edges 306 includes at least one rising edge 308 and at least one falling edge 310. The comparator 108 generates the plurality of edges by comparing the analog electrical signal to ground. At block 210, the single general purpose input/output pin 120 receives the plurality of edges. In some embodiments, the plurality of edges is generated by the analog-to-digital converter 160 (See FIG. 1B), which generates a digital representation of the line 302 illustrated in FIG. 3B.

In another alternative embodiment, the electronic processor 102 generates the plurality of edges from the underdamped transient response as it is received directly at the general purpose input/output pin 120. The electronic processor 102 is configured to read a binary one when the voltage of the response exceeds a first threshold, and a binary zero when the voltage of the response falls below a second threshold.

At block 212, the electronic processor 102 determines a first response parameter based on the plurality of edges. In the example described herein, the first response parameter is a discharge time (that is, the settling time of the second-order circuit 106). For example, the electronic processor 102 may record the time when each of the plurality of edges is received, and determine the discharge time by comparing the time when the first of the plurality of edges is received to the time when the last of the plurality of edges is received.

At block 214, the electronic processor 102 determines a second response parameter based on the plurality of edges. In the example described herein, the second response parameter is a damping frequency (that is, the frequency at which the transient response oscillates). The plurality of edges represents the oscillations in the underdamped transient response. Accordingly, they may be used to determine the frequency of the underdamped transient response. For example, the electronic processor 102 may record the time when each of the plurality of edges is received, and determine from the times the oscillation rate of the underdamped transient response.

The first and second parameters (determined at blocks 212 and 214) of the underdamped transient response are based on the characteristics of the components of the second-order circuit which produced the response. Accordingly, the first and second parameters may be used to determine the characteristics of the components, and vice versa. For example, the following equations describe how the damping frequency ($\omega_n$) and the discharge time ($\tau$) are related to the resistance (R) of the resistor 132, the inductance (L) of the inductor 134, and the capacitance (C) of the capacitor 136 in the second-order circuit 106.

$$1/RC = 2\zeta\omega_n \quad (1)$$

$$\omega_n^2 = 1/LC \quad (2)$$

$$\tau 5 RC \quad (3)$$

where $\zeta$ is the damping ratio for the second-order circuit 106.

Using the above equations, the damping frequency ($\omega_n$) and discharge time ($\tau$) may be calculated for any given combination of resistance (R), inductance (L), and capacitance (C) values. The discharge time ($\tau$) for the second-order circuit 106 is determined by the resistance (R) and capacitance (C) values. The damping frequency ($\omega_n$) for the second-order circuit 106 is determined by the inductance (L) and capacitance (C) values. Thus, it is possible to construct many different combinations for the second-order circuit 106, and use damping frequency ($\omega_n$) and discharge time ($\tau$) values (for example, as determined at blocks 212 and 214) to identify which of the combinations for the second-order circuit 106 produced those values. By choosing resistance (R) and capacitance (C) values such that none of the combinations produce any overlapping values for discharge time ($\tau$), it is possible to use the discharge time ($\tau$) to determine the capacitance (C) value of the second-order circuit 106.

Figure 4A:
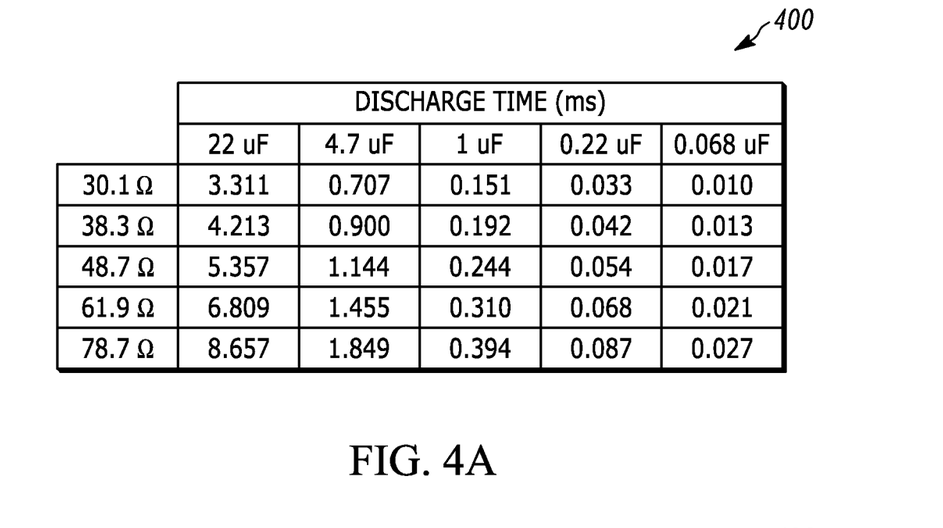
FIGS. 4A and 4B illustrate lookup tables used with the method of FIG. 2, in accordance with some embodiments.
Figure 4B:
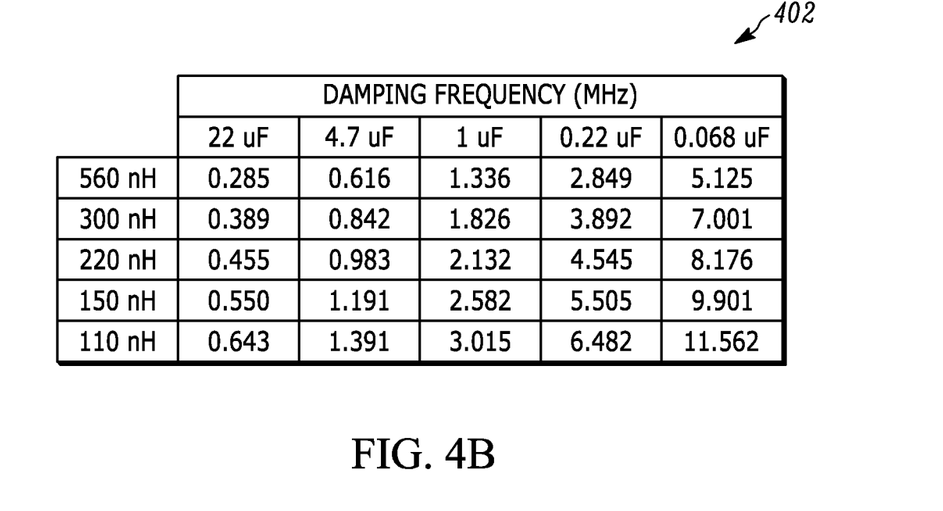

For example, FIG. 4A illustrates a table 400, which indicates which resistance (R) and capacitance (C) values correspond to a given discharge time ($\tau$). FIG. 4B illustrates a table 402, which indicates which inductance (L) value corresponds to a given capacitance (C) and damping frequency ($\omega_n$). In some embodiments, the memory 104 includes the tables 400 and 402. The table 400 illustrates twenty-five possible resistance-capacitance combinations, each of which may be combined with one of five possible inductance values, illustrated in the table 402. Accordingly, one hundred twenty-five different second-order circuit combinations are represented, each of which may be identified using a discharge time and a damping frequency.

In embodiments where the electronic processor 102 detects the underdamped transient response directly, the response signal is read with less resolution (for example, than when using a comparator). Accordingly, more separation between component characteristic values is used to reduce incorrect detection, and thus fewer combinations of the second-order circuit may be possible than with other embodiments.

Returning to FIG. 2, at block 216, when an analog-to-digital converter 160 is not included in the circuit board 100, at block 218, the electronic processor 102 determines a power-up parameter based on the first response parameter and the second response parameter. In one example, the first response parameter is a discharge time of 0.151 ms and the second response parameter is a damping frequency of 1.336 MHz. The electronic processor 102 retrieves from the memory 104 (in this example values from table 400) a capacitance value (1 µF) and a resistance value (30.1Ω) based on the discharge time. The electronic processor 102 then retrieves from the memory 104 (in this example values from table 402) an inductance value (560 nH) based on the capacitance value and the damping frequency.

In the example illustrated, the electronic processor 102 is thus able to determine which of one hundred twenty-five second-order circuit combinations makes up the second-order circuit 106. This should not be considered limiting. Alternative embodiments may utilize more or fewer second-order circuit combinations. Some embodiments may determine the power-up parameter based only on a capacitance and an inductance.

In some embodiments, the particular combination determined identifies the power-up parameter, which may be a board identifier or a power-up sequence identifier. For example, the memory 104 may include several versions of software for the circuit board 100, several different power-up sequences or some combination of both, each corresponding to one of the combinations represented in the tables 400 and 402. Accordingly, the electronic processor 102 retrieves the power-up parameter from the memory 104 based on the capacitance value, the inductance value, and the resistance value.

In embodiments of the circuit board 100 including an analog-to-digital converter 160 (See FIG. 1B), at block 222, the electronic processor 102 determines a third response parameter based on a peak voltage value received from the analog-to-digital converter. In such embodiments, the memory 104 also includes values for the peak voltage, which may be used, at block 224, in addition to the first and second response parameters, to determine the power-up parameter.

Regardless of how the power-up parameter is determined, at block 220, the electronic processor 102 controls the circuit board 100 based on the power-up parameter. For example, the electronic processor 102 may load a particular software version based on board identifier, and control the operations of the circuit board 100 by executing the software. In some embodiments, for example where the electronic processor 102 is a power management integrated circuit, the electronic processor 102 controls the power supply 112 and at least one power regulator (for example, the power regulator 114) to execute a power-up sequence indicated by the power-up sequence identifier.

Therefore, in some embodiments of the method 200, the electronic processor 102 determines one out of at least one hundred twenty-five power-up parameters using a single general purpose input/output pin. This is an advantage over known systems, which require seven pins to accommodate as many different power-up parameters.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method to determine a power-up parameter for a circuit board including an electronic processor, the method comprising:
   electrically exciting a second-order circuit to generate an underdamped transient response;
   receiving, at a comparator coupled to the second-order circuit, the underdamped transient response;
   generating, in response to the underdamped transient response received at the comparator, a plurality of edges;
   receiving, at a single general purpose input/output pin of the electronic processor, the plurality of edges;
   determining a discharge time based on the plurality of edges;
   determining a damping frequency based on the plurality of edges;
   determining the power-up parameter based on the discharge time and the damping frequency; and
   controlling the circuit board based on the power-up parameter.

2. The method of claim 1, wherein generating a plurality of edges includes generating at least one rising edge and at least one falling edge.

3. The method of claim 1, wherein determining the power-up parameter includes determining one of a board identifier and a power-up sequence identifier.

4. The method of claim 1, further comprising:
retrieving, from a memory coupled to the electronic processor, a capacitance value based on the discharge time;
retrieving from the memory an inductance value based on the capacitance value and the damping frequency; and
wherein determining the power-up parameter includes retrieving the power-up parameter from the memory based on the capacitance value and the inductance value.

5. The method of claim 4, further comprising:
retrieving a resistance value based on the discharge time, wherein determining the power-up parameter includes retrieving the power-up parameter based on the resistance value.

6. The method of claim 1, further comprising:
determining a peak voltage value received from an analog to digital converter coupled to the second-order circuit;
wherein determining the power-up parameter includes determining the power-up parameter based on the peak voltage value.

7. The method of claim 1, further comprising:
controlling at least one power regulator based on the power-up parameter.

8. A system to determine a power-up parameter for a circuit board, the system comprising:
a second-order circuit configured to generate an underdamped transient response when electrically excited; and
a comparator coupled to the second-order circuit and configured to, in response to receiving the underdamped transient response, generate a plurality of edges;
an electronic processor, coupled to the comparator, and configured to
receive, at a single general purpose input/output pin, the plurality of edges;
determine a discharge time based on the plurality of edges;
determine a damping frequency based on the plurality of edges;
determine the power-up parameter based on the discharge time and the damping frequency; and
control the circuit board based on the power-up parameter.

9. The system of claim 8, wherein the plurality of edges includes at least one rising edge and at least one falling edge.

10. The system of claim 8, wherein the power-up parameter is one of a board identifier and a power-up sequence identifier.

11. The system of claim 8, further comprising:
a memory coupled to the electronic processor, wherein the electronic processor is configured to retrieve from the memory a capacitance value based on the discharge time;
retrieve from the memory an inductance value based on the capacitance value and the damping frequency; and
retrieve the power-up parameter from the memory based on the capacitance value and the inductance value.

12. The system of claim 11, wherein the electronic processor is configured to retrieve a
resistance value based on the discharge time; and
retrieve the power-up parameter from the memory based on the resistance value.

13. The system of claim 8, further comprising:
an analog to digital converter coupled to the second-order circuit, wherein the electronic processor is configured to
determine a peak voltage value received from the analog to digital converter;
determine the power-up parameter based on the peak voltage value.

14. The system of claim 8, further comprising:
at least one power regulator, wherein the electronic processor is configured to control the at least one power regulator based on the power-up parameter.

15. The system of claim 8, wherein the electronic processor is configured to control the circuit board based on the power-up parameter.

16. A method to determine a power-up parameter for a circuit board including an electronic processor, the method comprising:
electrically exciting a second-order circuit to generate an underdamped transient response;
receiving, at a single general purpose input/output pin of the electronic processor, the underdamped transient response;
generating, in response to the underdamped transient response received at the single general purpose input/output pin of the electronic processor, a plurality of edges;
determining a discharge time based on the plurality of edges;
determining a damping frequency based on the plurality of edges;
determining the power-up parameter based on the discharge time and the damping frequency; and
controlling the circuit board based on the power-up parameter.

* * * * *